(12) United States Patent
Jeurissen et al.

(10) Patent No.: US 8,660,508 B2
(45) Date of Patent: *Feb. 25, 2014

(54) CALIBRATION OF PASSIVE HARMONIC-REJECTION MIXER

(75) Inventors: Dennis Jeurissen, Graz (AT); Gerben Willem de Jong, Veldhoven (NL); Jan van Sinderen, Liempde (NL); Johannes Hubertus Antonius Brekelmans, Nederweert (NL)

(73) Assignee: NXP, B.V., Eindhoven (NL)

( * ) Notice: Subject to any disclaimer, the term of this patent is extended or adjusted under 35 U.S.C. 154(b) by 122 days.

This patent is subject to a terminal disclaimer.

(21) Appl. No.: 13/266,744

(22) PCT Filed: Apr. 23, 2010

(86) PCT No.: PCT/IB2010/051784
§ 371 (c)(1),
(2), (4) Date: Jan. 12, 2012

(87) PCT Pub. No.: WO2010/125506
PCT Pub. Date: Nov. 4, 2010

(65) Prior Publication Data
US 2012/0105128 A1    May 3, 2012

(30) Foreign Application Priority Data
Apr. 28, 2009 (EP) .................................... 09100253

(51) Int. Cl.
*H04B 17/00*    (2006.01)
(52) U.S. Cl.
USPC ........ 455/226.1; 455/280; 455/283; 455/285; 455/294; 455/302

(58) Field of Classification Search
USPC ........................................................ 455/226.1
See application file for complete search history.

(56) References Cited

U.S. PATENT DOCUMENTS

| 4,710,890 A | 12/1987 | Bailey |
| 6,766,158 B1 | 7/2004 | Molnar et al. |

(Continued)

FOREIGN PATENT DOCUMENTS

| FR | 2 864 375 A1 | 6/2005 |
| JP | 06-078007 A | 3/1994 |

(Continued)

OTHER PUBLICATIONS

Weldon, J.A. et al., "A 1.75-GHz Highly Integrated Narrow-Band CMOS Transmitter With Harmonic-Rejection Mixers", IEEE J. of Solid-State Circuits, vol. 36, No. 12, pp. 2003-2015 (Dec. 2001).
International Search Report and Written Opinion for Int'l Patent Application No. PCT/IB2010/051784 (May 30, 2011).

*Primary Examiner* — Ajibola Akinyemi (57) ABSTRACT

An electronic device comprising a passive harmonic-rejection mixer (400) and a calibration circuitry (425). The passive harmonic rejection mixer has an input (102) connected to several sub-mixer stages (402), and the sub-mixer stages are connected to a summing module (406, 408) for generating the output (104). Each sub-mixing stage comprises a gating module (414), an amplifier (416), and a weighting module (418), the gating module selectively passing the input signal or the input signal with inverted polarity under the control of control signals. The calibration circuitry (425) is adapted to input a reference signal (430) to the input of the mixer, receive an output signal (104) from the output of the mixer, and set the weights (K1, K2, K3, K4) of the weighting modules to make the output signal match an expected output signal.

15 Claims, 9 Drawing Sheets

(56) References Cited

U.S. PATENT DOCUMENTS

| | | |
|---|---|---|
| 7,190,943 B2 | 3/2007 | Davis |
| 7,519,348 B2 * | 4/2009 | Shah ............................ 455/285 |
| 2004/0005869 A1 | 1/2004 | See et al. |
| 2005/0059376 A1 | 3/2005 | Davis |
| 2005/0070242 A1 | 3/2005 | Davis |
| 2005/0215223 A1 | 9/2005 | Lin et al. |
| 2005/0233723 A1 * | 10/2005 | Gomez et al. ................ 455/323 |
| 2005/0239430 A1 | 10/2005 | Shah |
| 2006/0205370 A1 | 9/2006 | Hayashi et al. |
| 2010/0253412 A1 | 10/2010 | Brekelmans et al. |
| 2010/0283526 A1 | 11/2010 | van Sinderen et al. |

FOREIGN PATENT DOCUMENTS

| | | |
|---|---|---|
| JP | 2005-159587 A | 6/2005 |
| WO | 2005/091493 A1 | 9/2005 |

\* cited by examiner

CALIBRATION OF PASSIVE HARMONIC-REJECTION MIXER

FIELD OF THE INVENTION

This invention relates to calibration of an electronic device comprising a passive harmonic-rejection mixer.

BACKGROUND OF THE INVENTION

Switching mixers with rejection properties on one or more odd higher harmonics are well known, see, e.g., J. A. Weldon et al., "A 1.75-GHz highly integrated narrow-band CMOS transmitter with harmonic-rejection mixers", IEEE Journal of Solid-State Circuits, Vol. 36, No. 12, December 2001, pp 2003-2015. A harmonic-rejection (HR) mixer allows simplifying the RF filtering. A typical HR mixer known in this field is an active (Gilbert) type of mixer. However, passive mixers are known to provide a better 1/f noise and higher linearity. On the other hand, a passive HR mixer is more difficult to implement.

Figure 1:
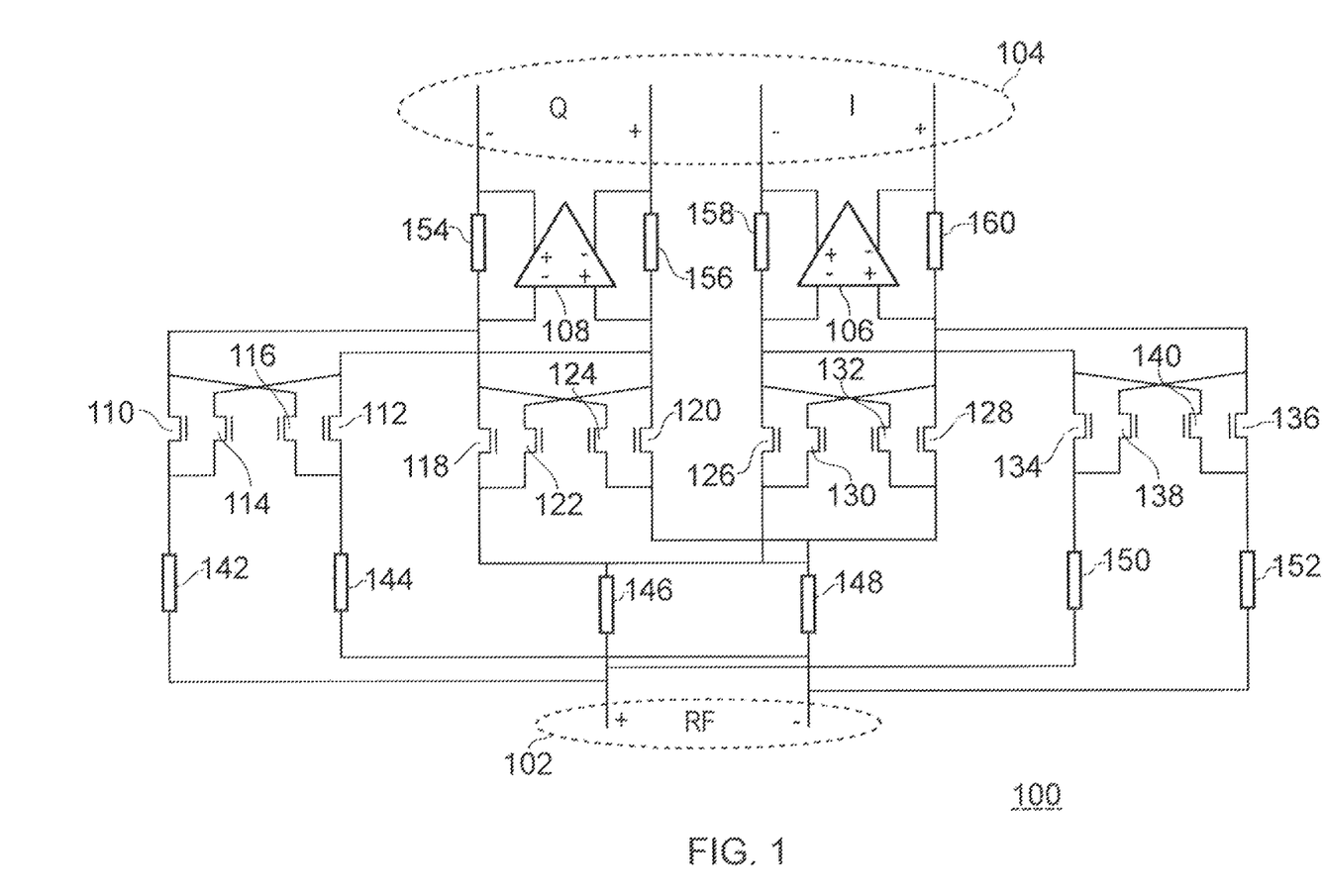
FIG. 1 is a block diagram of an HR mixer.

FIG. 1 shows a block diagram of an HR mixer 100, as published in WO 2009/019633. Mixer 100 is a quadrature mixer. Mixer 100 comprises an RF (radio/frequency) input 102 and an IF (intermediate frequency) output 104. Output 104 provides the in-phase output signal "I" and a quadrature output signal "Q" whose phase is shifted over 90° relative to signal "I". Mixer 100 comprises amplifiers 106 and 108, whose differential inputs are connected to input 102 via a switching network and whose differential outputs provide signals "I" and "Q". The switching network at input 102 is made up of switching FETs 110, 112, 114, 116; switching FETs 118, 120, 122, 124; switching FETs 126, 128, 130, 132; switching FETs 134, 136, 138, 140; and resistors 142, 144, 146, 148, 150 and 152. FETs 110 and 114 have their main current paths connected to input 102 via resistor 142. FETs 112 and 116 have their main current paths connected to input 102 via resistor 144. FETs 118, 122, 126 and 130 have their main current paths connected to input 102 via resistor 146. FETs 120, 124, 128 and 132 have their main current paths connected to input 102 via resistor 148. FETs 134 and 138 have their main current paths connected to input 102 via resistor 150. FETs 136 and 140 have their main current paths connected to input 102 via resistor 152. The input network together with resistors 154, 156, 158 and 160, configure amplifiers 106 and 108 as summing amplifiers.

Figure 2:
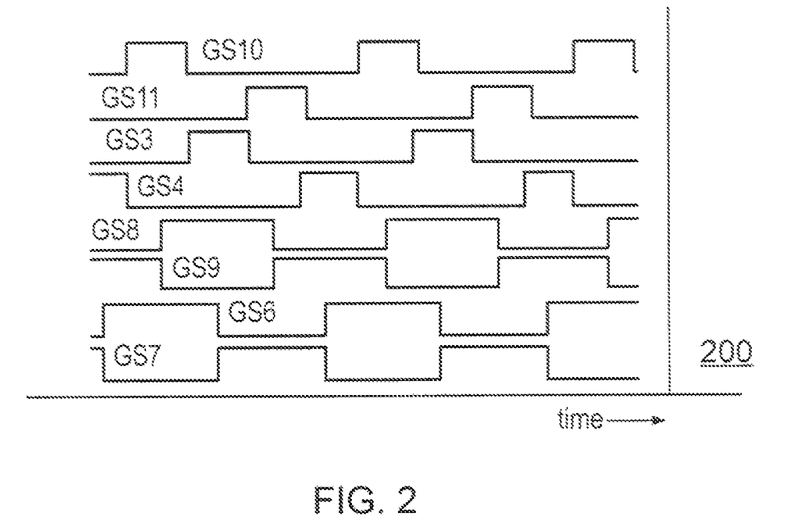
FIGS. 2 and 3 are signal diagrams explaining operation of the HR mixer of FIG. 1.

FIG. 2 is a diagram 200 of the control signals used to switch FETs 110-140. FETs 126 and 128 are controlled by a signal GS10. FETs 130 and 132 are controlled by a signal GS11. FETs 118 and 120 are controlled by a signal GS3. FETs 122 and 124 are controlled by a signal GS4. FETs 110 and 112 are controlled by a signal GS8. FETs 114 and 116 are controlled by a signal GS9. FETs 134 and 136 are controlled by a signal GS6. FETs 138 and 140 are controlled by a signal GS7. Signals 202-216 are derived from a local oscillator (not shown). As a result, signals "I" and "Q" form the weighted sum of the switched input signals, effectively forming the result of mixing the input signal at input 102 with control signals generated by the local oscillator.

Figure 3:
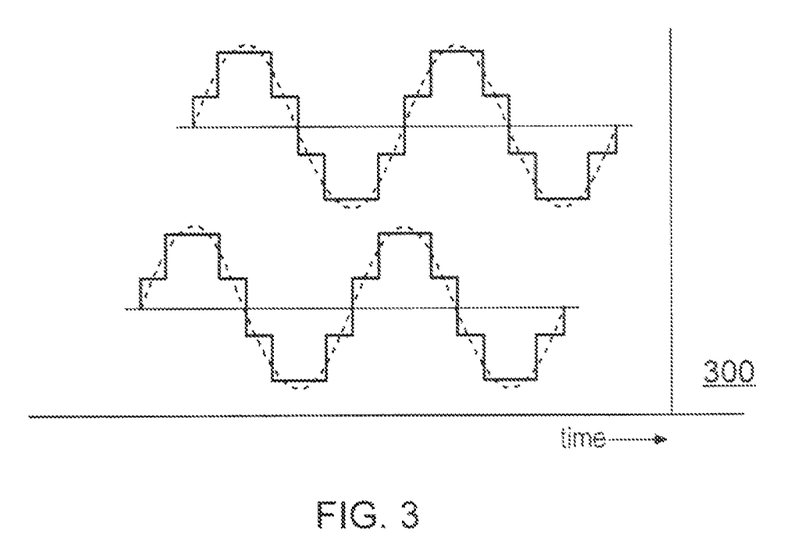

FIG. 3 is a diagram 300 of the effective resulting mixing waveforms for the "I" and "Q" signals. The mixing waveforms can be thought of as being build up by selectively combining the control signals of FIG. 2 so as to approximate the sine shape.

Although circuit 100 works well, the rejection of the third and fifth harmonic of the oscillator signal turns out to be hampered by the finite, frequency-dependent input impedance of amplifiers 106 and 108. This input impedance is a factor in the weighting of the RF currents used in creating the pseudo-sinusoidal mixing waveforms of FIG. 3. For example, in order to obtain a harmonic rejection of 65 dB the magnitude of the input impedance should be less than 0.3% of the RF series resistance, used to convert voltage into a current. In a typical case, the RF series resistance has a value of 100 Ohm. The input impedance should then have a value lower than 0.3 Ohm. This can be difficult to realize, particularly as it needs to be maintained over the frequency range of the received RF signal and its harmonics. The input impedance results from feedback applied to a bandwidth-limited amplifier, and the nature of the impedance typically changes with frequency from inductive to capacitive, peaking to a real value somewhere in between.

This dependence on the frequency makes it very difficult to compensate for the input impedance, for example in the values of the resistors used in circuit 100.

Despite their better 1/f noise and better linearity, passive switching mixers (such as the mixer 100) with harmonic-rejection properties are currently not widely used. One reason for this, is that the input impedance of the IF amplifier cannot be made sufficiently small to provide the required accuracy in the weighting of RF currents that is needed to achieve high values of harmonic-rejection. Additionally, accurate calibration of the circuit is desirable to achieve effective cancellation of the odd mixer harmonics, and to improve the harmonic rejection.

SUMMARY OF THE INVENTION

The inventors propose to improve the Harmonic Rejection, by adopting a segmented approach to the design such as that described in non-prepublished patent application PCT/IB2008/054466, and by adding calibration circuitry for calibrating the mixer. More specifically, the inventors propose an electronic device as defined in claim 1 and a calibration method as defined in claim 12. The incremental steps of the mixing waveform are realized using individual sub-mixing stages, and the harmonic conversion products of the mixers substantially cancel one another out when the outputs of the segments are combined together. Therefore, the finite IF amplifier input impedance does not significantly degrade the rejection of the harmonics, and the requirements on the input impedance of the IF amplifiers can be relaxed. The calibration circuitry implements a calibration method for fine-tuning the weighting of each sub-mixer stage, so that the harmonic conversion products of the mixers more fully cancel one another out, improving the overall harmonic rejection of the mixer. Such calibration can help compensate for processing variations and component mis-matches.

BRIEF DESCRIPTION OF THE DRAWINGS

Embodiments of the invention will now be described, by way of example and with reference to the accompanying drawings, wherein.

Throughout the Figures, similar or corresponding features are indicated by the same reference numerals.

DETAILED DESCRIPTION OF EMBODIMENTS

Figure 4:
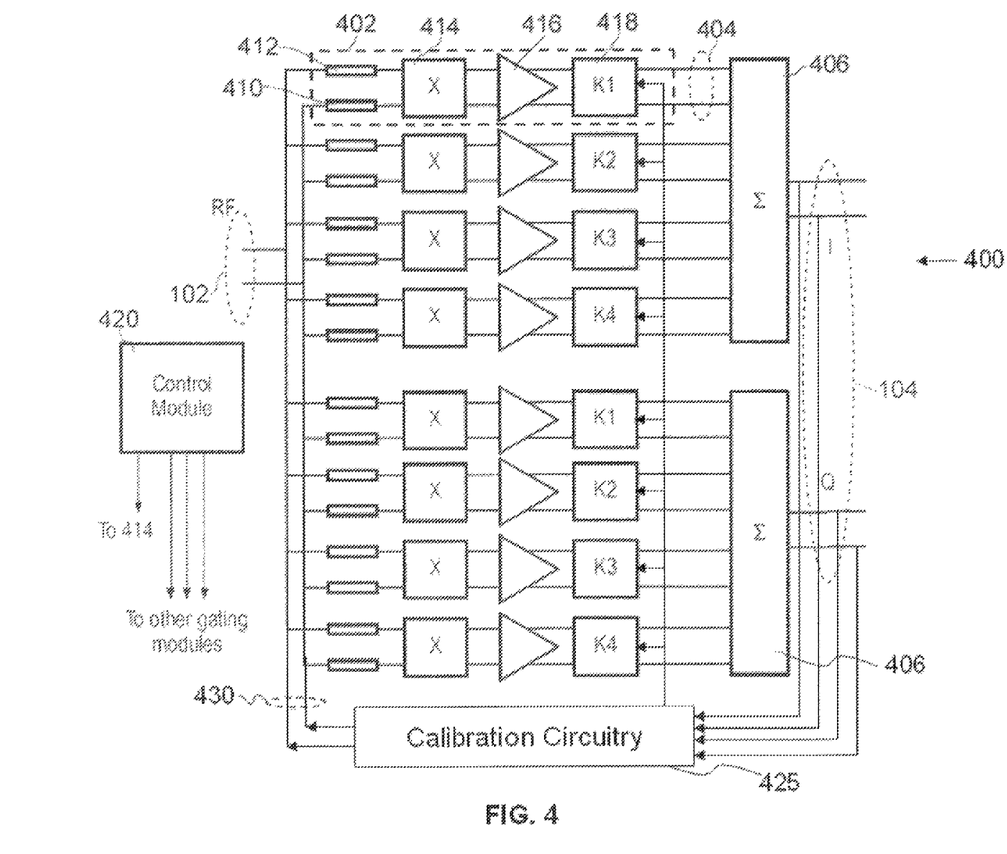
FIG. 4 is a block diagram of an electronic device according to a first embodiment of the invention.

FIG. 4 is a diagram of an electronic device comprising a passive HR mixer 400 and a calibration circuitry 425 according to a first embodiment of the invention. Mixer 400 has an input 102 receiving an RF input signal and an output 104 for supplying in-phase (I) and quadrature (Q) IF output signals. In the example shown, the input signal and output signal are differential signals. The "I" and "Q" signals together form a complex signal from which positive and negative spectral components can be separately extracted. In another example (not shown), only one of the signals "I" and "Q" are generated. The mixer 400 comprises multiple segments that are all of similar configuration connected to the input 102. In order to not obscure the drawing, only one of the segments has been labeled by reference numeral 402.

The configuration of the segments is now discussed with reference to segment 402, and is applicable to all segments. Segment 402 has a segment output 404 for supplying a weighted contribution to the differential output signals 104. For each output signal (I or Q) the mixer 400 comprises a summing module, here summing modules 406 and 408, connected to the relevant segment outputs, for summing the respective weighted contributions. Segment 402 comprises segment input resistors 410 and 412, a gating module 414, a differential amplifier 416, and a weighting module 418. The segment 402 is the same as the other segments, except for that the weighting modules have different scaling factors (k1, k2, k3, or k4).

The gating module 414 selectively routes or blocks the currents, that are representative of the RF input signal and that flow through segment input resistors 410 and 412, to the inputs of amplifier 416 under control of control signals supplied to gating module 414 by a control module 420. The signal currents are passed either directly (+1) or inverted (−1), or blocked ("0"). The operation of gating module 414 could also be described as that of a tristate module, or of a multiplier that multiplies the currents by a factor +1, a factor 0, or a factor −1. The selective routing and the control signals for the gating module are discussed further below in relation to FIGS. 5, 6, and 7. In other embodiments, for example the fourth embodiment, the gating module multiplies the currents by either +1 or −1, and does not use a blocking state.

The segment input resistors 410 and 412 act to convert the RF voltage signal into a current signal for the gating module 416, although other means of converting the RF voltage signal into currents will also be apparent to those skilled in the art, such as transconductance amplifiers (also known as V-to-I converters, or gm cells).

The amplifier 416 receives the signal output from the gating module and supplies the amplified signal at the output to weighting module 418. The weighting module 418 outputs a weighted contribution to the output signal 404 by scaling the signal received from amplifier 416 by a scaling factor k1. Each of the segments has a different scaling factor (k1, k2, k3, k4). The weighting modules 418 may be implemented using a gain setting of the amplifiers 416, the gain set according to the scaling factors k1, k2, k3 and k4.

The calibration circuitry 425 is connected to the input 102 of the mixer 400, the output 104 of the mixer 400, and to the weighting modules 418. The calibration circuitry drives the input of the mixer 400 with a reference signal 430, monitors the signals on the output 104, and calibrates the mixer by altering the scaling factors k1, k2, k3, k4 until the signals on the output 104 closely match the expected signal, the expected signal being the signal that is to be expected from a correctly calibrated mixer when driven by reference signal 430. There are multiple different reference signals 430 that could be applied to the mixer input 102 for implementing the calibration. One option is to apply a small DC reference signal to the input 102, and to adjust the scale factors k1, k2, k3, k4 until the mixer output signal matches the mixing (local oscillator) frequency, i.e. until the output signal contains minimal harmonics of the local oscillator frequency. Another option is to apply the mixing frequency or a harmonic of the mixing frequency to the input 102, and to adjust the scale factors k1, k2, k3, k4 until the DC component of the output signal reduces to zero.

Figure 5:
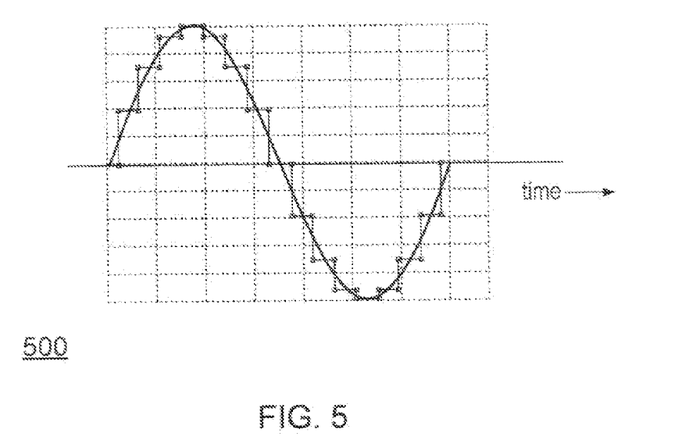
FIGS. 5 and 6 are signal diagrams explaining operation of the HR mixer of FIG. 4.
Figure 6:
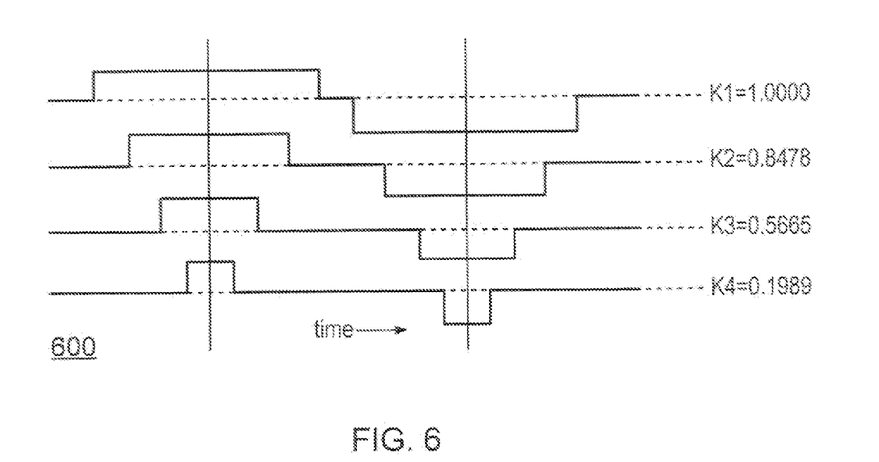

An implementation of gating module 414 will now be described with reference to FIGS. 5, 6 and 7. FIG. 5 is a diagram 500 of a mixing waveform that approximates a sine wave. The approximation can be created by selectively adding the square waves in the diagram 600 in FIG. 6. Note that each square wave can assume three different values, and that the square waves that contribute to shaping those portions of the sine wherein the values change slowly (i.e., near the top or near the bottom of the sine) are scaled by a small factor (k3, k4), and that the square waves that contribute to those portions of the sine where the values change rapidly (i.e., at the steep flanks) are scaled by a larger factor (k1, k2). The various normalized values of these scale factors k1, k2, k3, and k4 are indicated to the right of diagram 600, and these values are set so that the square waves combine to approximate a sine wave (for example as shown in FIG. 5), as will be apparent to those skilled in the art.

Each segment uses a respective control signal, and the uppermost square wave in the diagram 600 is used in the gating module of the segment having a scaling factor of k1, the next square wave is used in the gating module of the segment having a scaling factor of k2, the next square wave is used in the gating module of the segment having a scaling factor of k3, and the lowermost square wave is used in the gating module of the segment having a scaling factor of k4.

Figure 7:
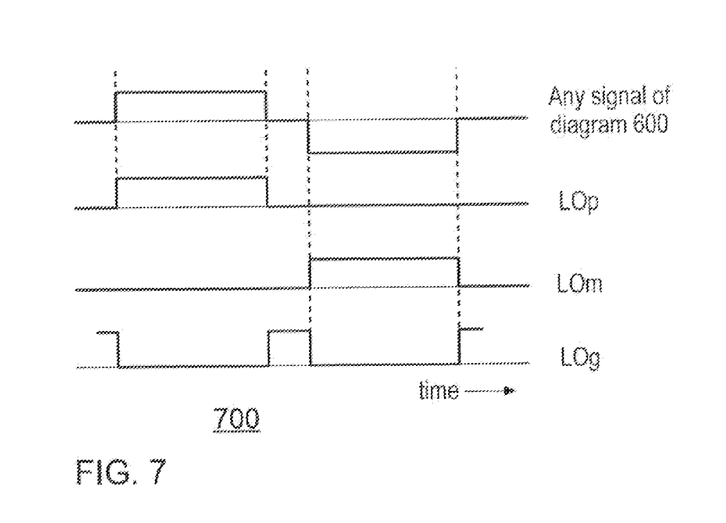
FIGS. 7 and 8 are circuit diagrams of components used in the HR mixer of FIG. 4.

FIG. 7 shows a circuit diagram of gating module 414 at the transistor level, and a timing diagram 700 of the signals that are applied to the individual transistors. If the signals LOg and LOm are low, and signal LOp is high, then output signal IFp equals input signal RFp (the RF signal at the "+" branch of input 102), and output signal IFm equals input signal RFm (the RF signal at the "−" branch of input 102). If the signals LOg and LOp are low, and signal LOm is high, then output signal IFp equals input signal RFm and output signal IFm equals input signal RFp. If LOg is high and LOp and LOm are low, then the output signals IFp and IFm are floating and input signals RFp and RFm are grounded. Accordingly, the differential signal received at amplifier 416 is controlled via gating module 414.

Figure 8:
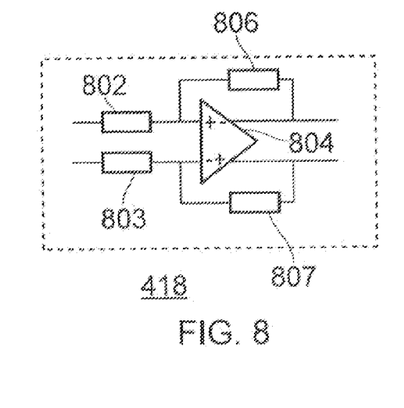

The outputs of amplifier 416 of segment 402 are supplied to weighting module 418 for scaling the signal with the appropriate scaling factor (k1). An example implementation of weighting module 418 is the voltage amplifier circuit shown in FIG. 8, wherein the ratio of the resistance value of resistors 802 and 803, at the input of an amplifier 804, to the resistance value of resistors 806 and 807, at the output of amplifier 804, determines the scaling factor.

The rejection of the harmonic conversion products of the mixer is obtained by cancellation when the output signals of each segment are combined together in summing modules 406 and 408. Since the gating module of each segment uses a square wave control signal, the harmonic components cancel one another to approximate a sine wave, for example as shown in FIG. 5. The cancellation is improved by making sure that the scaling factors k1, k2, k3, and k4 are accurately set. This accurate setting of the scaling factors is achieved by using the calibration circuitry 425 to finely tune the scaling factors until the harmonic components at the mixer output reduce to close to zero. The resistor values of segment input resistors 410 and 412 are preferably the same for every segment, as are the gating modules and the amplifiers.

The circuit of FIG. 4 implements the weighting of the various segments in the IF domain, i.e. after the RF signal has been down-mixed to IF. Since the transfer function of each segment is the same, each segment fully loads the RF source, even though the contributions of different segments to the final IF signal can differ vastly according to the different scaling factors k1, k2, k3, and k4.

A second embodiment will now be described with reference to FIGS. 9 and 10, which show diagrams of a further mixer 900. This embodiment improves on the conversion efficiency of the mixer 400, the mixer conversion efficiency being defined as the ratio between the power of the IF output signal and the power of the RF input signal. The mixer 900 uses segments in a similar arrangement to the mixer 400 of FIG. 4, however, the segments of the mixer 900 can each comprise multiple sub-mixing stages that are hereinafter referred to as "unit cells". The unit cells are all substantially identical to one another, and each comprise one gating module and one respective IF amplifier.

Different segments have different numbers of unit cells. For example, the segment 902 in mixer 900 has 5 unit cells (indicated by the label "5x"), the segment next to it has 4 unit cells (indicated by the label "4x"), etc. As most of the weighting is now implemented in the RF domain by having different numbers of unit cells for each control signal, the loading of the RF signal by individual segments is more proportional to their contribution to the IF signal at outputs 104. The efficiency of mixer 900 is roughly one and a half times better than that of mixer 400.

Figure 9:
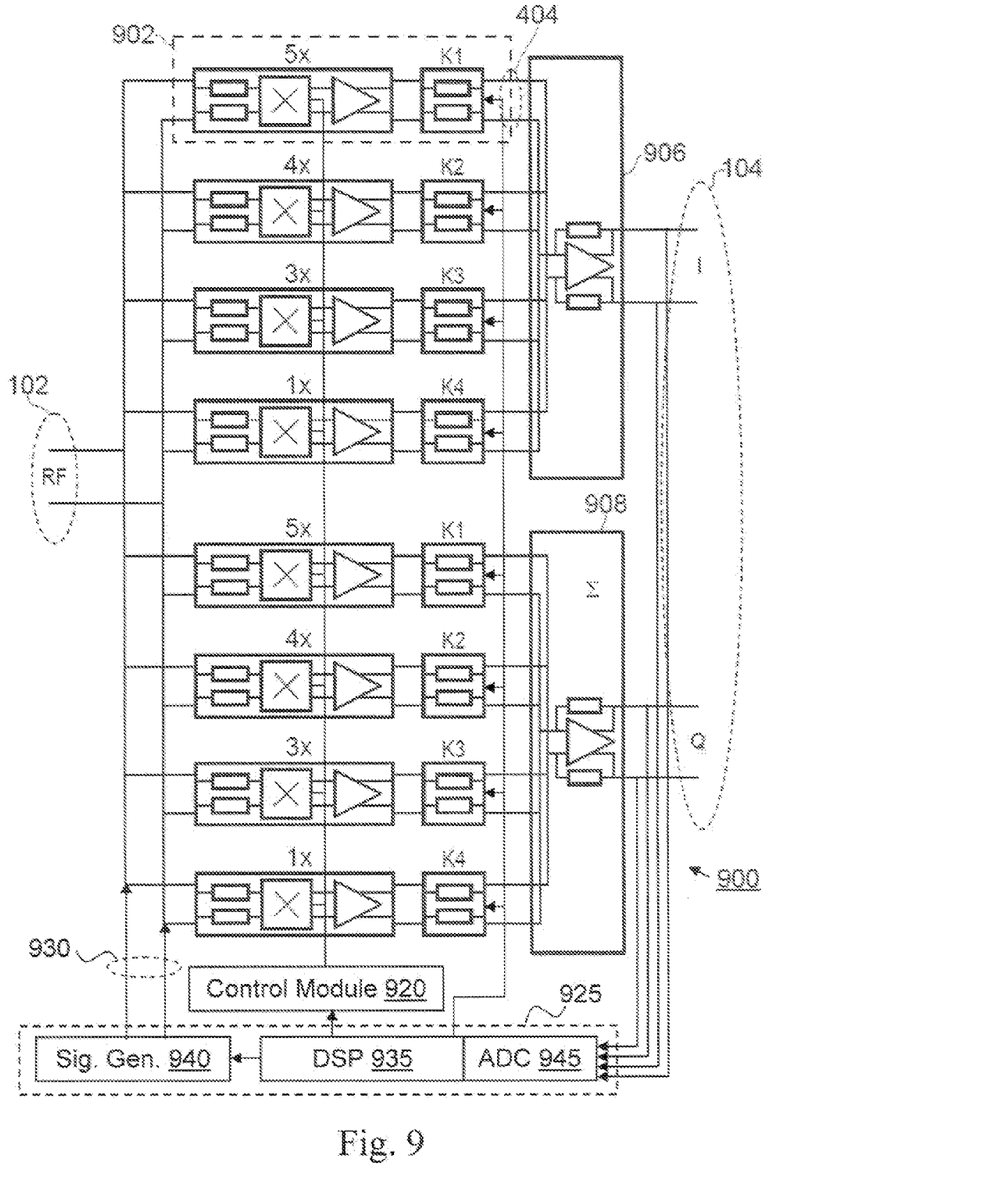
FIGS. 9 and 10 are block diagrams of an HR mixer according to a second embodiment of the invention.
Figure 10:
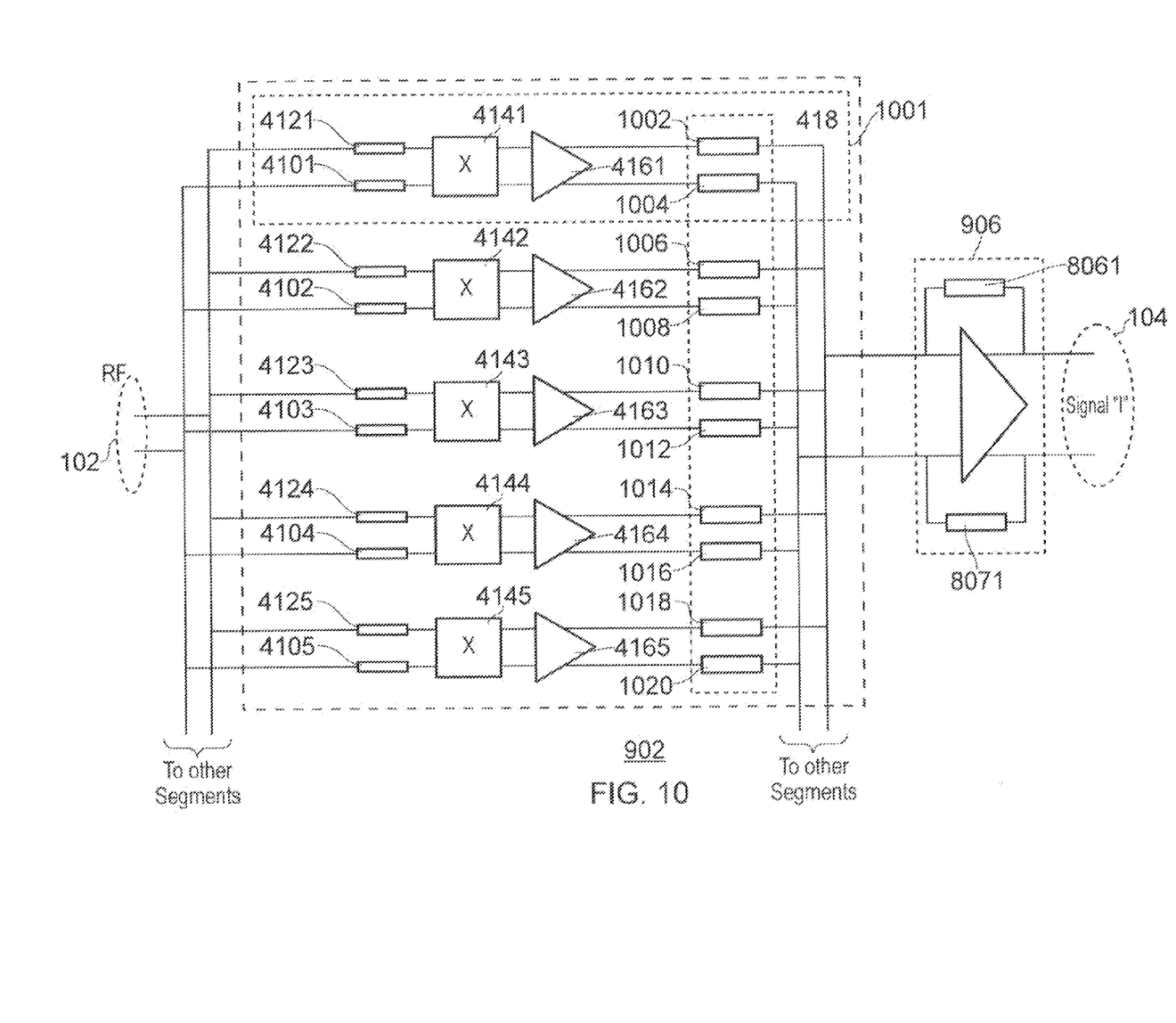

The segment 902 of FIG. 9 is shown in more detail in FIG. 10, and is built up of five (5x) unit cells arranged in parallel between input 102 and a summing module 906, for enabling a coarse (integer) weighting in the RF-domain combined with a fine (fractional) weighting in the IF-domain. One of the unit cells of FIG. 10 has been indicated with a reference numeral 1001. Unit cell 1001 comprises unit cell input resistors 4121 and 4101 (equivalent to resistors 412 and 410 of mixer 400), gating module 4141 (equivalent to gating module 414), amplifier 4161 (equivalent to amplifier 416), and unit cell output resistors 1002 and 1004 that control the weighting of the signal from unit cell 1001 into the summing module 906. Note that the weighting and summation that in mixer 400 was carried out by module 418 and module 406, is now combined, owing to the allocation of the unit cell output resistors 1002 and 1004, and resistors 8061 and 8071.

The resistance values of the unit cell input resistors 4121, 4101, 4122, 4102, 4123, 4103, 4124, 4104, 4125, and 4105 for all the segments are all the same as one another. The unit cell input resistors could in an alternative implementation be replaced by other voltage to current converting means, in a similar manner as described above in relation to the segment input resistors of mixer 400.

The segment 902 has five unit cells, comprising five gating modules 4141, 4142, 4143, 4145, and five respective amplifiers 4161, 4162, 4163, 4164, 4165. Each respective one of the gating modules is connected to a respective one of the amplifiers. The outputs of the amplifiers 4161, 4162, 4163, 4164, 4165 are each connected to the summing module 906 via respective pairs of unit cell output resistors 1002 and 1004, 1006 and 1008, 1010 and 1012, 1014 and 1016, and 1018 and 1020, which implement the weighting modules. The resistance values of these unit cell output resistors 1002, 1004, 1006, 1008, 1010, 1012, 1014, 1016, and 1018 within segment 902 are all set at similar values to one another by the calibration circuit 925, although the resistance value of these resistors may be set differently for each segment according to the signal weighting required for the segment.

Each output resistor is formed by one or more sub-resistors that are selected from several sub-resistors of differing values, the selection being made by the DSP 935 as a result of the calibration process. The selection is made by switching sub-resistors in or out until the output resistor has the required value.

As in mixer 400, each segment of mixer 900 is supplied with a respective control signal. Therefore the gating modules (for example 4141, 4142, 4143, 4144, and 4145) of all the unit cells within a segment (for example 1001) are all supplied with the same control signal. The control signals for the segments are all generated by a control module 920 similar to the control module 420 of mixer 400.

Each unit cell of a segment can be said to contribute a "coarse" weighting to the segment output, and the higher the number of unit cells in a segment, the higher the contribution that the segment makes to the output signal. The pairs of unit cell output resistors can be said to contribute a "fine" weighting to the segment output. As mentioned earlier, the unit cell output resistors within a segment all have the same resistance value as one another, and this value can be used to fine-tune the contribution that the segment makes to the output signal. The calibration circuitry 925 can be used to accurately set the values of these output resistors, to improve the cancellation of the harmonic products of the mixer. To summarise, the more unit cells there are in a segment, and the smaller the unit cell output resistors of the segment, the greater the current that is contributed from that segment to the final output signal.

The weighting of the various segments in mixer 900 will now be described, using the same values k1=1.0000, k2=0.8478, k3=0.5665, and k4=0.1989 for the various segments as used in the first embodiment (refer to FIG. 6). If each unit cell contributes a coarse weighting of 0.2, then in the case of the k1=1 weighted segment 902, 5 unit cells (0.2*5=k1) are required to give a factor of k1=1. No further weighting by the unit cell output resistors is required.

In the case of the k2=0.8478 segment, 4 unit cells (0.2*4=0.8) are needed to give a coarse weighting of 0.8, and then the unit cell output resistors need to be set to give a fine weighting (amplification) of 0.8478/0.8=1.0598. Hence, the unit cell output resistors for the k2 segment are set at 1/1.0598=0.9436 times the values of the unit cell output resistors for the k1 segment.

Likewise, for the k3=0.5665 segment, 3 unit cells (0.2*3=0.6) are needed to give a coarse weighting of 0.6, and then the unit cell output resistors need to be set to give a fine weighting (amplification) of 0.5665/0.6=0.9442. Hence, the unit cell output resistors for the k3 segment are set at 1/0.9442=1.0591 times the values of the unit cell output resistors for the k1 segment.

Again, for the k4=0.1989 segment, 1 unit cell (0.2*1=0.2) is needed to give a coarse weighting of 0.2, and then the unit cell output resistors need to be set to give a fine weighting (amplification) of 0.1989/0.2=0.9945. Hence, the unit cell output resistors for the k4 segment are set at 1/0.9945=1.0055 times the values of the unit cell output resistors for the k1 segment.

The values of the unit cell output resistors can be accurately set to compensate for processing variations and circuit mismatches by using calibration circuitry 925. The calibration circuitry 925 is similar to the calibration circuitry 425 of the first embodiment, although further comprises an output for specifying the control signals that should be generated to the control module 920. This additional output enables the calibration circuitry to control the timing of the mixer (control) signals, meaning that one segment can be selected to be driven with control signals whilst the others are not driven, to enable more accurate calibration. For example, a first segment may be driven and the other segments left in-active to enable calibration and setting of the output resistor values for the first segment, and then a second segment may be driven and the other segments left in-active to enable calibration and setting of the output resistor values for the second segment. As will be apparent to those skilled in the art, the expected output signal to be used in the calibration can be easily calculated based on what the theoretical output would be for a perfectly calibrated mixer given the reference signal and the control signals. For example, the theoretical output frequencies of a mixer are widely known to be equal to the sums and differences of the mixer input frequencies.

The calibration circuitry 925 comprises a Signal Generator 940 for generating the reference signal 930 that is input to the mixer 900 during calibration, and a Digital Signal Processor 935 that has an Analogue to Digital converter 945 for sampling the output signal 104 from the mixer.

In the embodiment of FIG. 9 the unit cells are all identical, except for that the unit cell output resistors have different values for different segments, as described directly above. An alternate implementation would be to make the values of all the unit cell output resistors all the same as one another, and to add a further pair of resistors between each segment output and the summing amplifier. Then, the resistance values of the further pairs of resistors could be set for each segment according to the fine weighting required for that segment, and calibrated by the calibration circuitry.

It will be apparent to those skilled in the art that many different arrangements of segment/unit cell input resistors and/or segment/unit cell output resistors can be used before and after the gating modules and IF amplifiers, provided that the net result is that the signal though each segment is correctly weighted for the particular control signal that is used in the gating module(s) of that segment. More specifically, the result of the weightings of the segments should be that the RF signal has, in effect, been mixed with a signal approximating a sine wave signal. The weightings can be controlled by controlling the resistance values of the segment/unit cell input resistors and/or segment/unit cell output resistors. If transconductance amplifiers (gm cells) are used in place of resistor pairs, then the V/I ratio can be controlled to control the weighting. The calibration method enables the weightings to be accurately set to help compensate for process variations etc.

A further improvement to the harmonic rejection of the mixer can be obtained by making all of the control signals identical (except for a phase shift) to one another. As the control signals driving the mixer influence the mixer's transfer function, making all control signals identical results in a more complete cancellation of the harmonic mixer products, and so the IF amplifier input impedances have even less of a degradative effect on the mixer's harmonic rejection performance. The third and fourth embodiments of the invention both use identical control signals, and will now be described with reference to FIG. 11 and FIG. 12.

Figure 11:
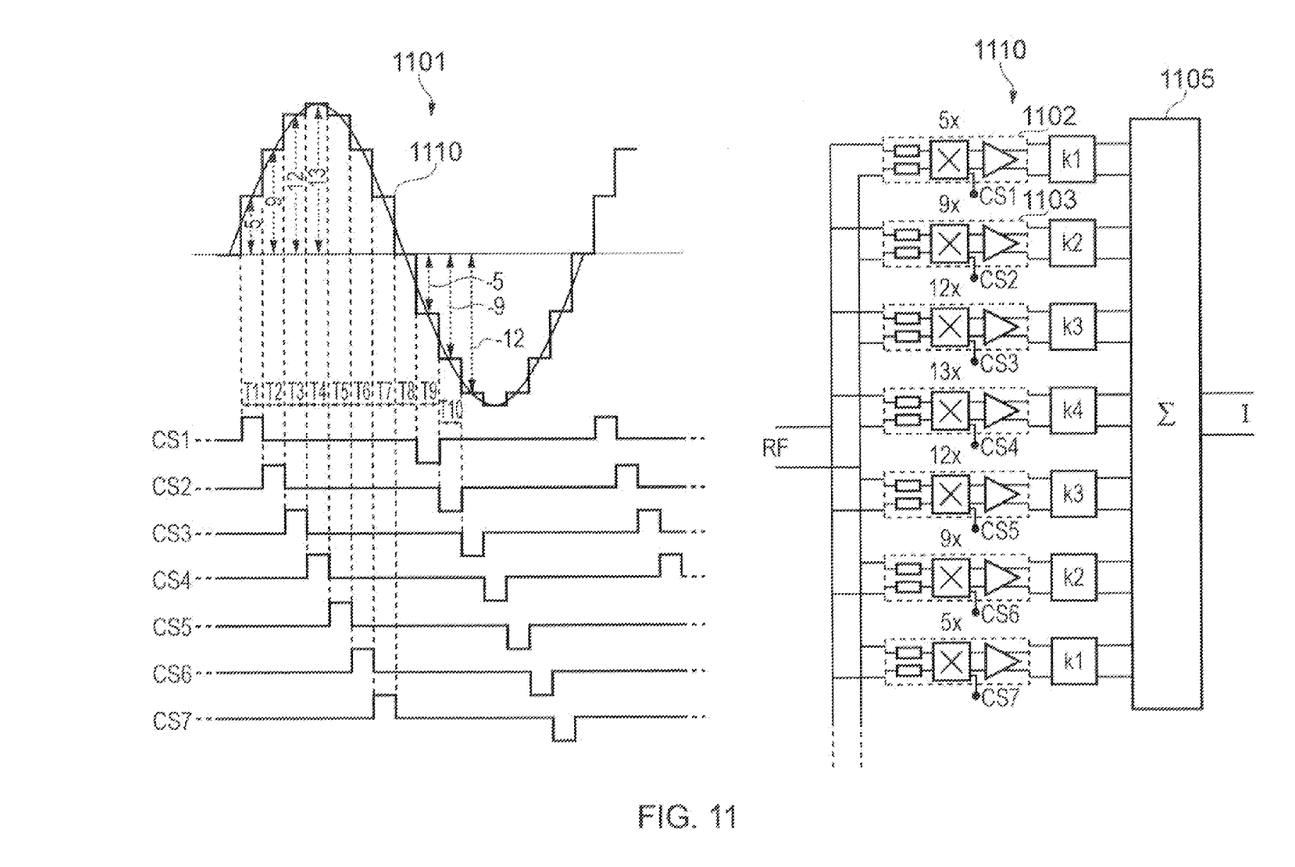
FIG. 11 shows circuit and signal diagrams of an HR mixer according to a third embodiment of the invention.

FIG. 11 shows a mixer 1100 and a signal diagram 1101 according to the third embodiment of the invention. The mixer 1100 comprises seven segments, each segment indicated as having 5, 9, 12, or 13 unit cells. As with the first and second embodiments, each unit cell comprises one gating module connected to one respective amplifier.

The seven segments each receive one of the control signals CS1, CS2, CS3, CS4, CS5, CS6 and CS7, and the control signal that a segment receives is used to control all the gating modules of the unit cells of that segment. The control signals CS1-CS7 are generated by a control module similar to the control module 420 of mixer 400. As can be seen on the timing diagram 1101, the waveforms of the control signals CS1-CS7 are all the same as one another, and have different phase shifts to one another.

The control signals control the gating modules in a similar manner as described above in relation to FIGS. 5, 6, and 7. When a control signal is positive, the gating modules pass the RF input signal, when the control signal is zero, the gating modules block the RF signal, and when the control signal is negative, the gating modules pass the RF input signal with inverted polarity.

The control signals CS1-CS7 are used to control the segments so that the RF input signal is effectively mixed with a signal 1110 approximating a sine wave. For example, segment 1102 has five unit cells and is controlled by control signal CS1, and segment 1103 has nine unit cells and is controlled by control signal CS2. During a first time period T1, the control signal CS1 signal is positive, and all the other control signals are zero. The positive control signal CS1 is applied to the five gating modules of the five unit cells of segment 1102, and so each unit cell of segment 1102 contributes to the output signal giving a relative weighting of five. The zero control signals CS2-CS7 are applied to the other segments, and so the gating modules of these segments block the RF input signal, and so the unit cells of these segments do not contribute to the output signal. Hence, the RF input signal is effectively mixed with a relative amplitude of five during time period T1, as can be seen on signal 1110.

During a second time period T2, the control signal CS2 signal is positive, and all the other control signals are zero. The positive control signal CS2 is applied to the nine gating modules of the nine unit cells of segment 1103, and so each unit cell of segment 1103 contributes to the output signal giving a relative weighting of 9. The zero control signals CS1 and CS3-CS7 are applied to the other segments, and so the gating modules of these segments block the RF input signal, and so the unit cells of these segments do not contribute to the output signal. Hence, the RF input signal is effectively mixed with a relative amplitude of nine during time period T2, as can be seen on signal 1110.

During the time periods T3-T7, the other segments each have one time period where the unit cells of the segment contribute to the output signal. The number of unit cells in a segment controls the size of the contribution that the segment makes to the output signal, thereby mixing the RF input signal by the signal 1110. During time period T8, no contributions are made to the output signal, corresponding to the zero-crossing of the sine wave that is approximated by signal 1110.

At time period T9, the control signal CS1 is negative, and this means that the gating modules of the unit cells of segment 1102 pass the input signal with inverted polarity, making a contribution to the output signal with a relative weighting of −5. At time period T10, the control signal CS2 is negative, making a contribution to the output signal with a relative weighting of −9.

The weighting modules K1, K2, K3, and K4 of FIG. 11 can be set differently to one another and calibrated using calibration circuitry similar to calibration circuitry 425 or 925 to fine-tune the contributions from the different segments, in order to make the amplitudes of signal 1101 better approximate a sine wave.

The summing module 1105 sums the outputs of the segments of mixer 1100 to give the output signal I. An output signal Q is also generated by duplicate circuitry (not shown) to the circuitry in FIG. 11.

Figure 12:
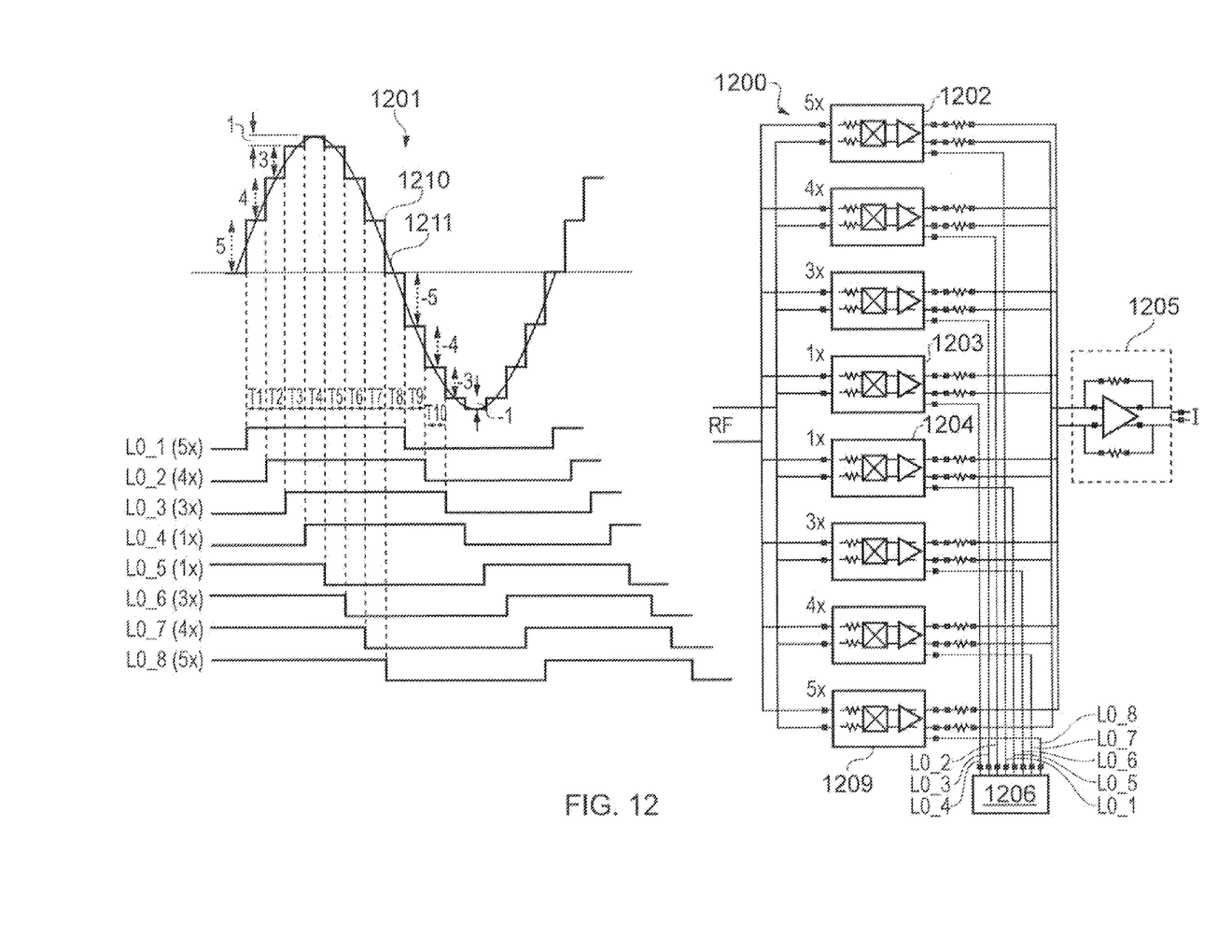
FIG. 12 shows circuit and signal diagrams of an HR mixer according to a fourth embodiment of the invention.

FIG. 12 shows a mixer 1200 and a signal diagram 1201 according to the fourth embodiment of the invention. The mixer 1200 comprises eight segments, each segment indicated as having 1, 3, 4, or 5 unit cells. As with the previous embodiments, each unit cell comprises one gating module connected to one respective amplifier.

The eight segments each receive one of the control signals LO_1, LO_2, LO_3, LO_4, LO_5, LO_6, LO_7, and LO_8, and the control signal that a segment receives is used to control all the gating modules of the unit cells of that segment. The control signals LO_1-LO_8 are generated by a control module 1206, similar to the control module 420 of mixer 400. As can be seen on the timing diagram 1201, the waveforms of the control signals LO_1-LO_8 are all the same as one another (they are identical except for phase shifts).

An important difference between the gating modules of this embodiment and the gating modules of the previous embodiments, is that the gating modules of this embodiment either pass the input signal, or pass the input signal with inverted polarity. The gating modules of this embodiment do not implement blocking of the input signal. Instead, the gating modules of this embodiment simply multiply the input signal currents by a factor of either 1 or −1. A consequence of this is that the control signals LO_1-LO_8 no longer have a zero state, but simply switch between positive (for passing the input signal) and negative (for passing the input signal with inverted polarity). The omission of the blocking state simplifies the gating modules and the control module.

The control signals LO_1-LO_8 all have a duty cycle of 50%, and this improves the robustness of the mixer as changes in the rise and fall times of the control signal have less of an impact on the effective mixing waveform.

As with the second and third embodiments, the numbers of unit cells per segment are set so that the RF input signal is effectively mixed with a signal 1210 approximating a sine wave. For example, the segments 1202 and 1209 with the largest numbers of unit cells are controlled by control signals LO_1 and LO_8 respectively to form the steep sides of the signal 1210 during time periods T1, T8 and T9. The segments 1203 and 1204 with the smallest number of unit cells are controlled by control signals LO_4 and LO_5 respectively to form the positive peak of the signal 1210 during time periods T3, T4 and T5. The unit cell output resistors can be fine tuned using a calibration circuitry similar to calibration circuitry 425 or 925, in order to improve the harmonic rejection of the mixer.

The summing module 1205 sums the outputs of the segments of mixer 1200 to give the output signal I. An output signal Q is also generated by duplicate circuitry (not shown) to the circuitry in FIG. 12.

Mixers according to embodiments of the invention are suited for use in, for example, RF tuners for cable modems, DVD recorders, set-top boxes, RF apparatus, up-conversion mixers for transceiver functions, and other electronic devices.

In summary, there is provided an electronic device comprising a passive harmonic-rejection mixer and a calibration circuitry. The passive harmonic rejection mixer has an input connected to several sub-mixer stages, and the sub-mixer stages are connected to a summing module for generating the output. Each sub-mixing stage comprises a gating module, an amplifier, and a weighting module, the gating module selectively passing the input signal or the input signal with inverted polarity under the control of control signals. The calibration circuitry is adapted to input a reference signal to the input of the mixer, receive an output signal from the output of the mixer, and set the weights (scale factors) of the weighting modules to make the output signal match an expected output signal.

The invention claimed is:

1. An electronic device comprising:
   passive harmonic-rejection mixer with an input for receiving an input signal and an output for supplying a output signal, wherein:
   the mixer comprises multiple segments connected to the input of the mixer;
   each respective one of the segments comprises a respective gating module for gating the input signal, a respective amplifier for amplifing the signal from the respective gating module, and a respective weighting module for weighting the signal from the respective amplifier and for supplying a respective contribution to the output signal;
   the mixer further comprising a summing module for summing the contributions to the output signal and for supplying an output signal to the output of the mixer; and
   the electronic device further comprises a calibration circuitry for applying a reference signal to the input of the mixer, for receiving an output signal from the output of the mixer, and for modifying the weights of the weighting modules to make the output signal match an expected output signal.

2. The electronic device of claim 1, wherein each gating module is controllable between passing the input signal directly, and passing the input signal with inverted polarity, according to a control signal.

3. The electronic device of claim 1, wherein each weighting module is one of a variable resistance, a transconductance amplifier with a variable gain, and a voltage amplifier circuit with a variable gain.

4. The electronic device of claim 1, wherein each said gating module is connected to the input for receiving the input signal via a respective pair of resistors, or via a respective transconductance amplifier.

5. The electronic device of claim 1, wherein at least one of the respective segments comprises a further gating module for gating the input signal, a further amplifier for amplifing the signal from the further gating module, and a further weighting module for weighting the signal from the further amplifier and for supplying a further contribution to the output signal; and wherein the respective amplifier, the respective gating module, and the respective weighting module form a unit cell of the segment, and the further amplifier, the further gating module, and the further weighting module form a further unit cell of the segment.

6. The electronic device of claim 5, wherein different said segments comprise different numbers of unit cells, the number of unit cells in a segment being determined according to the size of the contribution that the segment is to make to the output signal.

7. The electronic device of claim 6, further comprising a control module for supplying control signals, and wherein each respective said segment is supplied with a respective control signal for controlling the gating modules of the segment.

8. The electronic device of claim 7, wherein the respective control signals all have the same waveforms as one another and are shifted in phase with respect to one another.

9. The electronic device of claim 1, wherein the calibration circuitry comprises:
   a Signal Generator for generating and applying the reference signal to the input of the mixer; and
   a Digital Signal Processor for sampling the output signal of the mixer, comparing the output signal to an expected output signal, and varying the weights of the weighting modules to make the output signal match the expected output signal, wherein the expected output signal is the signal to be expected at the output of a correctly calibrated mixer.

10. The electronic device of claim 9, wherein the Digital Signal Processor is operable to specify the reference signals to be generated by the signal generator.

11. The electronic device of claim 10, wherein the Digital Signal Processor is operable to specify the control signals to be generated by the control module.

12. A method for calibrating an electronic device, the electronic device comprising a passive harmonic-rejection mixer and a calibration circuitry, the method comprising:
   applying a reference signal to an input of the mixer, the mixer comprising multiple segments connected to the input of the mixer, each respective one of the segments comprising a respective gating module for gating the input signal, a respective amplifier for amplifing the signal from the respective gating module, and a respective weighting module for weighting the signal from the respective amplifier and for supplying a respective contribution to the output signal; the mixer further comprising a summing module for summing the contributions to the output signal and for supplying an output signal to the output of the mixer;
   receiving an output signal from the output of the mixer; and
   modifying the weights of the weighting modules to make the output signal match an expected output signal.

13. The method of claim 12, wherein each gating module is controllable between passing the input signal directly, and passing the input signal with inverted polarity, according to a control signal, and wherein the method further comprises specifying the control signals.

14. The method of claim 13, comprising:
   specifying the control signals to activate only a first one of the segments, and then setting the weights of the first segment by;
   said applying step
   said receiving step; and
   said modifying step;
   specifying the control signals to activate only a second one of the segments, and then setting the weights of the second segment by;
   said applying step
   said receiving step; and
   said modifying step.

15. The method of claim 13, wherein the control signals are specified to switch at a low enough frequency for at least the $3^{rd}$, $5^{th}$ and $7^{th}$ harmonic modulation products to all fall within a bandwidth of the amplifiers of the segments.

* * * * *